United States Patent
Masucci et al.

(10) Patent No.: US 7,824,223 B1
(45) Date of Patent: Nov. 2, 2010

(54) PORTABLE ASSEMBLY HAVING A SUBSCRIBER IDENTIFICATION MODULE

(75) Inventors: Christopher M. Masucci, Des Moines, IA (US); Kenneth C. Clark, Ankeny, IA (US); David M. Thompson, Hope, ND (US); Michael A. Hajicek, West Fargo, ND (US); Todd A. Braun, Fargo, ND (US); Christopher J. Schmit, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 12/425,506

(22) Filed: Apr. 17, 2009

(51) Int. Cl.
  *H01R 9/09* (2006.01)
(52) U.S. Cl. .............................. 439/620.22; 439/620.21
(58) Field of Classification Search ............ 439/620.22, 439/620.21
  See application file for complete search history.

(56) References Cited

U.S. PATENT DOCUMENTS

| | | | |
|---|---|---|---|
| 4,932,885 A | 6/1990 | Scholz | |
| 6,175,517 B1 | 1/2001 | Jigour et al. | |
| 6,808,396 B2 * | 10/2004 | Kawaguchi et al. | 439/76.1 |
| 6,816,386 B2 | 11/2004 | Oguchi et al. | |
| 6,902,435 B1 | 6/2005 | Cheng | |
| 6,975,879 B1 | 12/2005 | Shishikura et al. | |
| 7,006,349 B2 | 2/2006 | Nuovo et al. | |
| 7,114,659 B2 | 10/2006 | Harari et al. | |
| 7,118,419 B1 * | 10/2006 | Lee | 439/630 |
| 7,341,198 B2 | 3/2008 | Nishizawa et al. | |
| 7,448,914 B2 * | 11/2008 | Calvas et al. | 439/638 |
| 7,510,444 B2 * | 3/2009 | Chang et al. | 439/630 |
| 2002/0055291 A1 * | 5/2002 | Maiterth et al. | 439/326 |
| 2005/0108571 A1 | 5/2005 | Lu et al. | |
| 2005/0245136 A1 | 11/2005 | Yin et al. | |
| 2006/0291483 A1 | 12/2006 | Sela | |
| 2007/0127220 A1 * | 6/2007 | Lippert et al. | 361/737 |
| 2009/0069048 A1 * | 3/2009 | Yang | 455/558 |
| 2009/0124126 A1 * | 5/2009 | Cho et al. | 439/607.31 |

FOREIGN PATENT DOCUMENTS

| | | |
|---|---|---|
| EP | 0965937 | 12/1999 |
| EP | 1602058 | 12/2005 |

* cited by examiner

*Primary Examiner*—Gary F. Paumen

(57) ABSTRACT

An electrical assembly comprises a housing having a frame portion. A substrate has a first side and a second side opposite the first side. A subscriber identification module is mounted to a first side of the substrate and has device terminals. A first connector portion is secured to the second side of the substrate and has connector terminals. A retainer is associated with an interior of the frame portion. The retainer retains at least one of the substrate and the first connector portion. Conductive (e.g., conductive vias or through-holes) in the substrate connect the connector terminals to the device terminals.

20 Claims, 3 Drawing Sheets

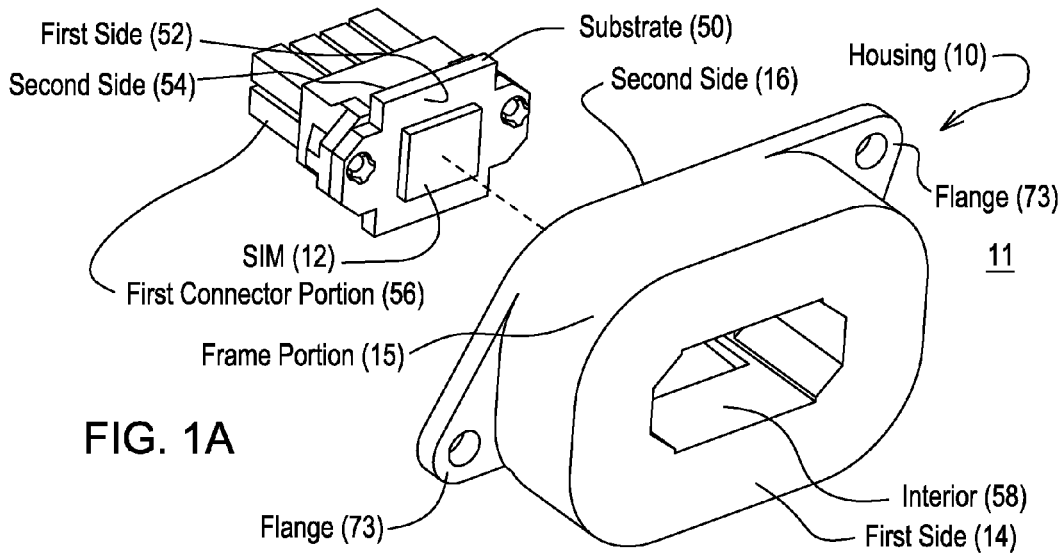
FIG. 1A
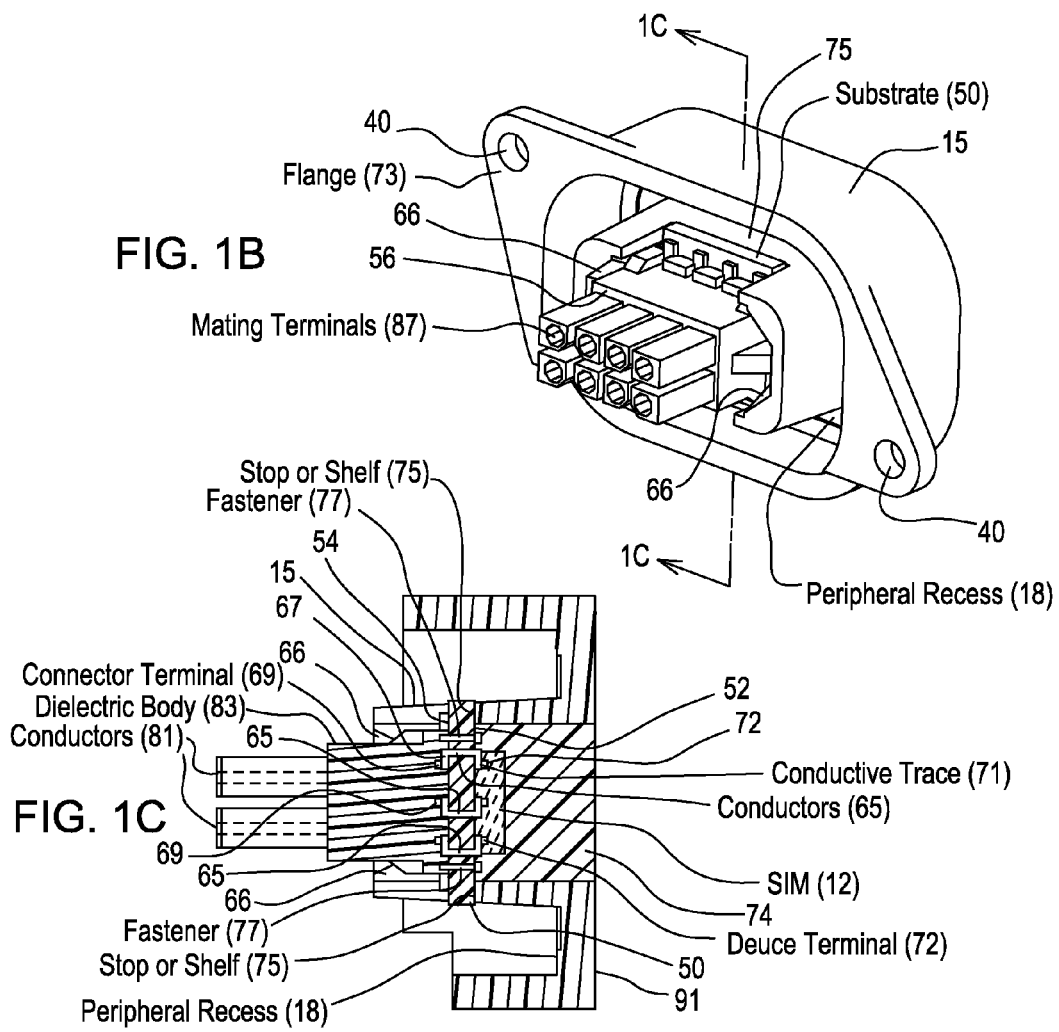
FIG. 1B
FIG. 1C

PORTABLE ASSEMBLY HAVING A SUBSCRIBER IDENTIFICATION MODULE

FIELD OF THE INVENTION

This invention relates to a portable assembly having a subscriber identification module.

BACKGROUND OF THE INVENTION

Subscriber identification modules are used in wireless transceivers to assign unique identifiers for each subscriber or user of the wireless transceiver. Further, the subscriber identification module may be associated with a network service provider or a wireless access provider or the level of service available for a particular subscriber. Accordingly, there is need for a portable assembly having a subscriber identification module for reliably adding a subscriber identification module to a wireless device or transceiver, consistent with resistance to shock, vibration, and thermal stress.

SUMMARY OF THE INVENTION

In accordance with one embodiment, an electrical assembly comprises a housing having a frame portion. A substrate has a first side and a second side opposite the first side. A subscriber identification module is mounted to a first side of the substrate and has device terminals. A first connector portion is secured to the second side of the substrate and has connector terminals. A retainer is associated with an interior of the frame portion. The retainer retains at least one of the substrate and the first connector portion. Conductive vias or plated through-holes in the substrate connect the connector terminals to the device terminals.

BRIEF DESCRIPTION OF THE DRAWINGS

FIG. 1A is an exploded perspective view of a first embodiment of an assembly having a subscriber identification module.

FIG. 1B is a perspective view of the first embodiment of the assembly in accordance with FIG. 1A.

FIG. 1C is a cross-sectional view of the assembly as viewed along reference line 1C-1C of FIG. 1B.

DESCRIPTION OF THE PREFERRED EMBODIMENT

Figure 1D:
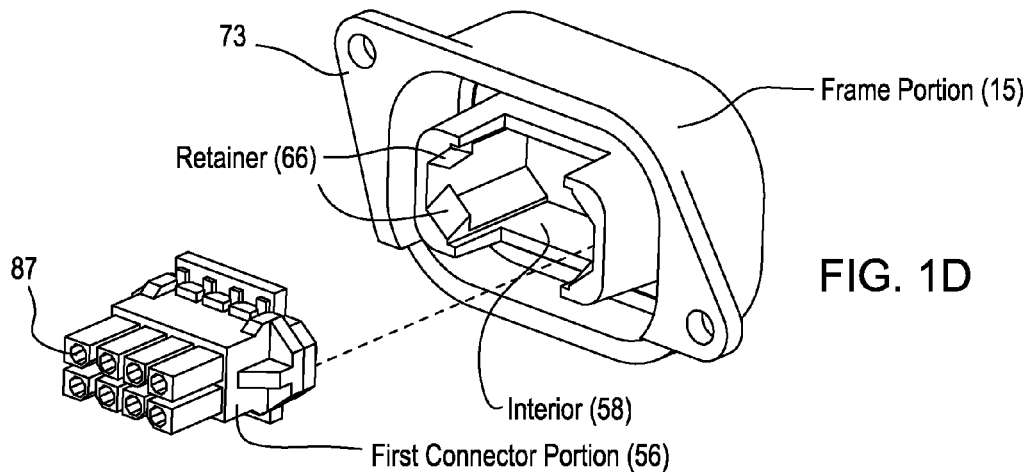
FIG. 1D is another exploded perspective view of the first embodiment of an assembly in accordance with FIG. 1A.

A first embodiment of the assembly 11 is generally illustrated in FIG. 1A through FIG. 1F, inclusive. In accordance with the first embodiment of the assembly 11, FIG. 1A, FIG. 1B, FIG. 1C, and FIG. 1D illustrates a housing 10 having a first side 14 and a second side 16. The housing 10 has a frame portion 15. As illustrated in FIG. 1A, the frame portion is generally annular or elliptical. A substrate 50 has a first side 52 and a second side 54 opposite the first side 52. A subscriber identification module (SIM) 12 is mounted to a first side 52 of the substrate 50 and has device terminals 72 (in FIG. 1C). A first connector portion 56 is secured to the second side 54 of the substrate 50 and has connector terminals 69 (in FIG. 1C). For example, the first connector portion may be secured to the substrate 50 via fasteners 77. A retainer 66 is associated with an interior 58 of the frame portion 15. The retainer 66 retains at least one of the substrate 50 and the first connector portion 56. Conductive vias 65 or metal or alloy plated through-holes (filled with an electrically conductive material) in the substrate connect the connector terminals 69 to the device terminals 72.

The housing 10 includes a first side 14 and a second side 16 opposite the first side 14. The housing 10 comprises a frame portion 15 with one or more flanges 73 extending (e.g., radially) from the frame portion 15. The flange 73 is arranged for securing the housing 10 and the assembly 11 to a mounting surface 32 (FIG. 1E) via fasteners, adhesive bonding or otherwise, for example. The frame portion 15 has an interior 58 associated with the retainer 66. The frame portion 15 of the housing defines a central hollow region.

Figure 1E:
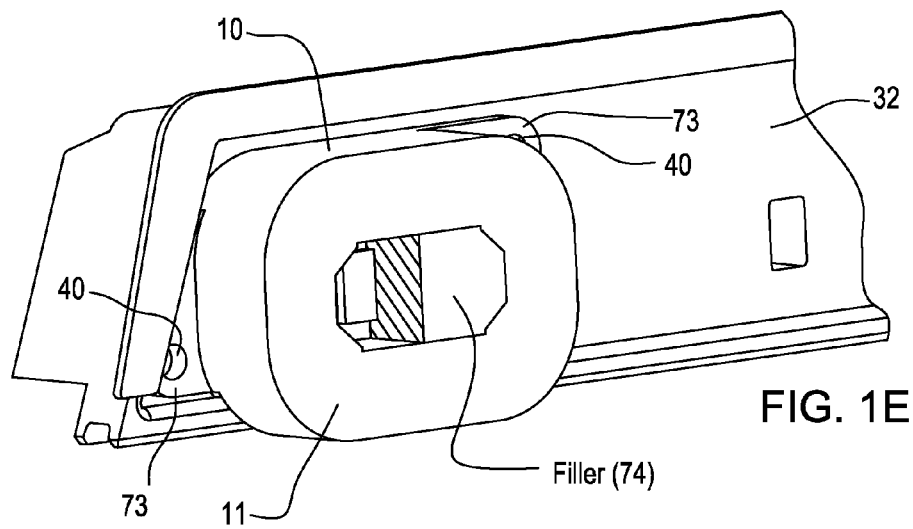
FIG. 1E is a perspective view of the assembly mounted on a mounting surface with the filler cut away to reveal the subscriber identification module.
Figure 1F:
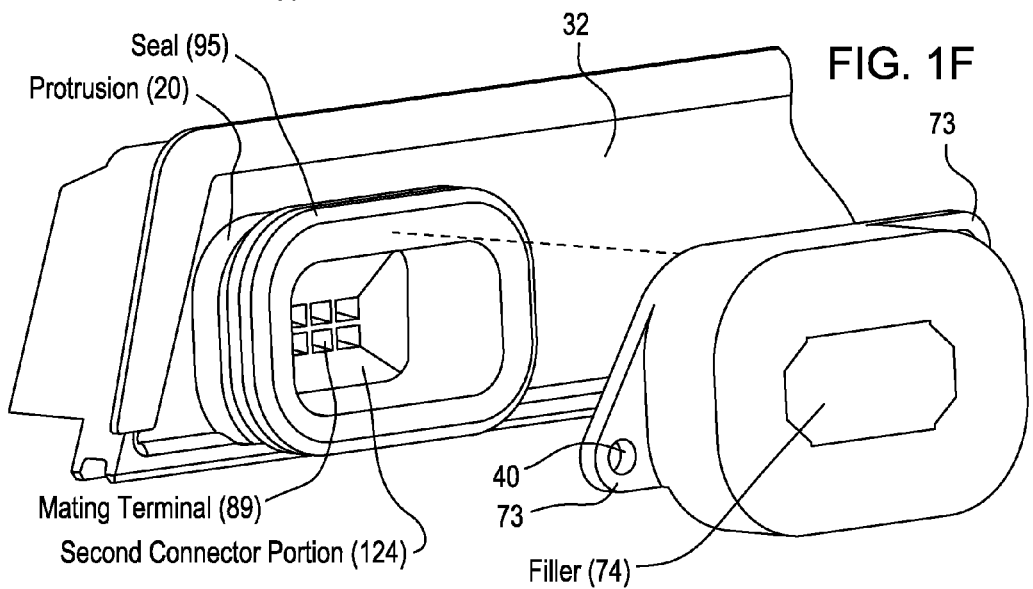
FIG. 1F is another perspective exploded view of the assembly spaced apart from the mounting surface.

The electrical connector comprises a first connector portion 56 that mates with a second connector portion 124 (FIG. 1F). Each connector portion (56, 124) comprises a dielectric body 83 (FIG. 1C) and conductors 81 (shown as dashed lines) having connector terminals 69 and mating terminals (87). The mating terminals (87) of the first connector portion 56 physically contact and electrically contact the mating terminals 89 of the second connector portion 124 to allow the reliable transmission of electrical signals within the voltage and current ratings of the connector. The first connector portion 56 may comprise a first plug or a first socket, whereas the second connector portion 124 comprises a second plug or second socket that is compatible with or interlocks with the first connector portion 56. In one embodiment, the electrical connector supports a group of conductor terminals for a subscriber identification module (SIM) 12. For example, the group of conductor terminals may comprise one or more of the following: a reset input terminal, a clock input terminal, a ground terminal, a clock output terminal, a data input terminal, a data output terminal, and power input. The input and output terminals may be arranged for serial input or output of digital signal levels, for example.

The second connector portion 124 may be mounted in or on a mounting surface 32 or wall of an electronic device (e.g., wireless transceiver) or on a chassis.

In an alternate embodiment, the second connector portion 124 may comprise a surface mount device or a device designed for through-hole mounting, or otherwise on a substrate (e.g., circuit board) of an electronic device.

The subscriber identification module (SIM 12) comprises an electronic device that is capable of communication with an electric device (e.g., a wireless transceiver or terminal). In one embodiment, the SIM 12 comprises electronic memory (e.g., nonvolatile random access memory) and a card interface circuit (e.g., logic circuit) for wireless transceivers or terminals. For example, the SIM 12 may comprise a smart card that supports storage and retrieval of user data. The SIM 12 device may facilitate storage of user data, such as a user identifier, user location, subscriber number (e.g., user phone number) or user electronic address, network authorization data, user contact lists, stored text messages, user security data, and user passwords. The SIM 12 device may provide a personality to the associated electronics device based on the data stored within the SIM 12, where the personality tailors the electronics device to particular user preferences, particular user data, particular user settings, a particular selection of user programmable features, or particular functionality.

The SIM 12 is associated with a group of device terminals 72. For example, the group of device terminals 72 may comprise one or more of the following: a reset input terminal, a clock input terminal, a ground terminal, a clock output terminal, a data input terminal, a data output terminal, and power input.

In one embodiment, the SIM 12 is mounted within an interior 58 of the housing 10 or frame portion 15 of the housing 10 within the central hollow region. In a first example of the retainer 66, the combination of the SIM 12, the substrate 50, and the first connector portion 56 form a module that may be inserted into the interior 58 while the retainer 66 (e.g., snap-fit connectors) is generally elastically or resiliently movable (or even temporarily deformable). Once the assembly is assembled, one side of the module may rest against stop 75, whereas other opposite side of the module may be retained by retainer 66, which snaps back or returns back to its rest state after generally elastic or resilient deformation. The rest stop 75 may comprise a nib, shelf or other protrusion in the interior 58 of the housing 10 or the frame portion 15.

A first alternate retainer may be substituted for the retainer 66, where the third alternate retainer comprises a radially extending portion that extends radially inward from the frame portion 15 on one side and filler on the opposite side, where the substrate 50 or combination for the substrate 50, first connector portion 56 and SIM 12 are placed against the third alternate retainer and potted with the filler 74 on the opposite side to retain the combination or substrate 50. In the third alternate retainer, the stop 75 may be omitted or it may comprise nibs that deform as the substrate 50 is pressed past it against the third alternate retainer.

Once the module is snapped, locked or secured into place by the retainer 66, the volume above the SIM 12 and within a recess of first connector portion 56 is filled with a filler 74. Although FIG. 1E illustrates the volume partially filled with a filler 74, it is understood that the filler 74 of FIG. 1E is cut away to better reveal SIM 12. In one embodiment, the filler 74 is generally flush with an outer surface 91 of the housing 10 and generally fills any voids or air pockets within the interior 58. The filler 72 may comprise a potting compound, a polymer, a plastic, a fiber reinforced polymer, a fiber reinforced plastic, or a resin matrix the binds a reinforcing material. In one embodiment, the hardened or cross-linked filler 74 forms a hard shell or a protective membrane that is bonded to the housing 10 to isolate the SIM 12 from the external environment. For example, the filler 74 may isolate the SIM 12 from moisture, salt, water, or other foreign materials.

The housing 10 collectively with the filler 72 provides a rigid shell that protects the SIM 12 from mechanical or environmental damage on one side, and the filler 38 dampens vibrations.

In another embodiment, the filler 72 may comprise an elastomer, resilient polymer or other resilient material to dampen vibration and may further include ceramic particles in an elastomeric matrix to promote heat dissipation from the SIM 12 device.

The substrate 50 may comprise a circuit board, such a printed circuit board, a ceramic circuit board, or a fiberglass circuit board. The substrate 50 comprises a dielectric layer 93 and one or more conductive layers. For example, the substrate 50 may comprise a double-sided circuit board in which the dielectric layer 93 has first conductive traces 71 and second conductive traces 67 on opposite sides of the dielectric layer 93. The first conductive traces 71 may comprise conductive pads for mounting the SIM 12 with a surface mounting package (e.g., flip-chip) or other device terminals, for example.

The second conductive traces 67 may comprise conductive pads or conductive through-holes for mounting the first connector portion 56. The conductive traces (67,71) may be formed by electrodeposition, chemical etching, laser ablation, adhesive metallic layers, adhesively bonded metal foil, printed circuit board fabrication techniques, or otherwise.

Conductors 65 or conductive passages electrically connect the connector terminals 69 to the device terminals 72. In one embodiment, the conductors 65 are formed integrally in or on the substrate 50. The conductors 65 may comprise conductive vias or metallic plated through-holes in the substrate 50, for example. Further, the conductive vias or plated through holes may be filled with a conductive material such as an electrically conductive adhesive, solder, or an electrically conductive filler. The conductors 65 are mechanically and electrically connected to the conductive traces 71 or associated metallic pads on opposite sides of the dielectric layer 93.

The assembly 11 is capable of mounting on a mounting surface 32 (FIG. 1E and FIG. 1F) with a protrusion 20 that mates with, interlocks with, or engages a peripheral recess 18 in the housing 10. The peripheral recess 18 is located around a periphery of a second side 16 of the housing opposite a first side 14 of the housing 10. The protrusion 20 may be generally elliptical, annular, or rectangular with rounded edges or have virtually another suitable geometric shape. In one embodiment, the protrusion 20 aligns the first connector portion 56 and the second connector portion 124 for interlocking engagement as an electrical connector. In one configuration, the second connector portion 124 may be mounted on a secondary substrate (e.g., circuit board of an electronic device) or on the mounting surface 32 (e.g., an outer wall of a casing of the electronic device).

A seal 95 (e.g., a lip seal) may be placed in or in contact with the peripheral recess 18 to seal (e.g., hermetically seal) or to provide protection against the environment, including salt, fog, moisture, or liquids. Further, the seal 95 within the peripheral recess may prevent the ingress of dirt, debris, salt, water, moisture, or other foreign material into the assembly 11 that might otherwise interfere with the reliable operation of the SIM 12.

In one embodiment, the seal 95 comprises an elastomer, a resilient polymer or resilient plastic material. The flange 73 supports attachment to the mounting surface 32 via one or more fasteners. For example, in one configuration, the housing 10 has one or more bores 40 that support attachment of the assembly 11 to the mounting surface 32 via one or more fasteners.

The manufacturing process for the assembly 11 of FIG. 1A may be carried out as follows. First, the first connector portion 56 is soldered or electrically connected to one side of the substrate 50 and then the SIM 12 is soldered or electrically connected to the opposite side of the substrate 50. Second, the module comprising the first connector portion 56, the substrate 50 and SIM 12, is secured to a frame portion of the housing 12 via a retainer 66. Third, an outward facing portion of the SIM 12 may be potted or the recess filled with a filler 74 to encapsulate the SIM. Accordingly, the SIM is securely attached to the housing and is protected from the ingress or environmental exposure to salt, fog, debris and other materials.

Figure 2:
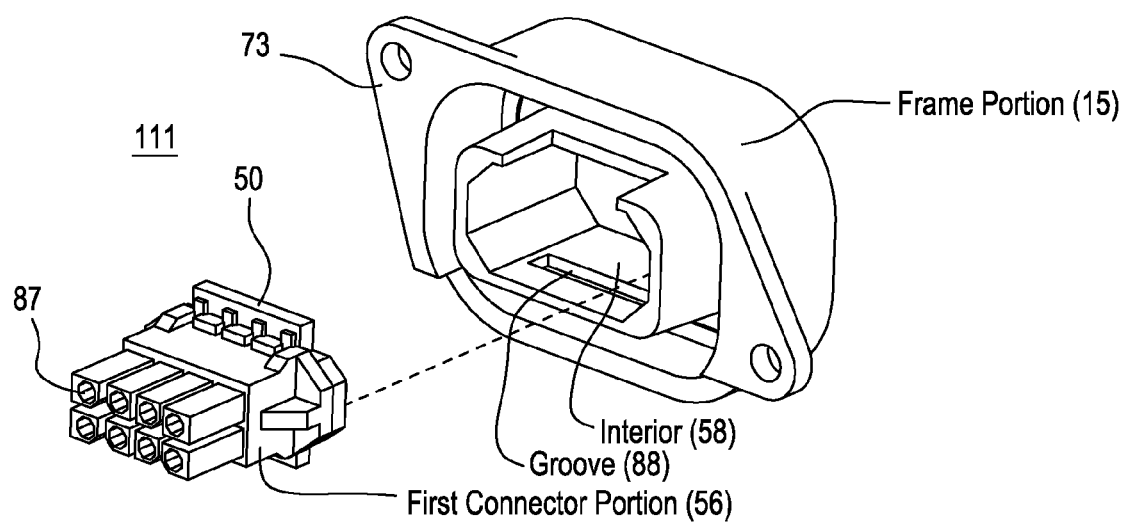
FIG. 2 shows an exploded perspective view of a second embodiment of the assembly.

The assembly 111 of FIG. 2 is similar to the assembly 11 of FIG. 1A through FIG. 1F, except that the assembly of FIG. 2 further includes a groove 88 in the interior 58 of the frame portion 15 and the retainer 66 may be omitted. The groove 88 may comprise a retainer or retention mechanism for receiving the substrate 50, the first connector portion 56, or both. In one embodiment, the groove 88 comprises generally linear groove) of a suitable size and shape for receiving a combined edge of a sandwiched substrate 50 and flange (or base) of the first connector portion 56. For instance, the groove may be located in an interior 58 such as a top, bottom or side to support a press-fit of the edge of the substrate 50 and the first connector portion 56. Alternately, the groove 88 may be of suitable size and shape for receiving an edge of a substrate 50 to secure the substrate 50 within the groove with or without an adhesive.

Having described the preferred embodiment, it will become apparent that various modifications can be made without departing from the scope of the invention as defined in the accompanying claims.

The following is claimed:

1. An electrical assembly comprising;
   a housing having a generally annular frame portion with an interior that defines a central hollow region;
   a substrate have a first side and a second side opposite the first side;
   a subscriber identification module mounted to a first side of the substrate and having device terminals;
   a first connector portion secured to the second side of the substrate and having connector terminals;
   a retainer associated with the interior of the frame portion, the retainer retaining at least one of the substrate and the first connector portion; and
   conductive vias or through-holes in the substrate for connecting the connector terminals to the device terminals.

2. The assembly according to claim 1 wherein the retainer comprises a retaining groove for receiving an edge of the substrate.

3. The assembly according to claim 1 wherein the retainer comprises a retaining groove for receiving a combined edge of a sandwiched substrate and flange of the first connector portion.

4. The assembly according to claim 1 wherein the retainer comprises a snap-fit connector portion for resiliently deforming and retaining the substrate.

5. The assembly according to claim 1 wherein the frame portion defines a central region that is filled with a filler to cover at least an outward facing portion of the subscriber identification module.

6. The assembly according to claim 5 wherein the retainer comprises a radially extending portion of that extends radially inward from the frame portion on one side and the filler on the opposite side.

7. The assembly according to claim 1 wherein the first electrical connector portion comprises a plug or a socket.

8. The assembly according to claim 1 wherein the device terminals comprise conductive pads.

9. The assembly according to claim 5 wherein the filler comprises one or more of the following: a polymer, a plastic an elastomer, an adhesive and a potting compound.

10. The assembly according to claim 1 further comprising:
    a secondary substrate; and
    a second connector portion for mating with the first connector portion, the second connector portion mounted to the secondary substrate.

11. The assembly according to claim 1 further comprising:
    a peripheral recess around a periphery of a second side of the housing opposite a first side of the housing;
    a seal within the peripheral recess for preventing the ingress of dirt, debris, salt, water, moisture, or other foreign material.

12. The assembly according to claim 11 further comprising:
    a mounting surface having a generally annular protrusion for interlocking with the peripheral recess.

13. The assembly according to claim 12 wherein the generally annular protrusion aligns the first connector portion and the second connector portion for interlocking engagement.

14. The assembly according to claim 1 wherein the housing further comprises a flange extending around at least part of the perimeter of the housing, the flange having bores for receiving fasteners for fastening the assembly to a mounting surface.

15. An electrical assembly comprising:
    a housing having a frame portion;
    a substrate have a first side and a second side opposite the first side;
    a subscriber identification module mounted to a first side of the substrate and having device terminals;
    a first connector portion secured to the second side of the substrate and having connector terminals;
    a retainer associated with an interior of the frame portion, the retainer retaining at least one of the substrate and the first connector portion, the retainer comprising a snap-fit connector portion for resiliently deforming and retaining the substrate; and
    conductive vias or through-holes in the substrate for connecting the connector terminals to the device terminals.

16. The assembly according to claim 15 wherein the frame portion defines a central region that is filled with a filler to cover at least an outward facing portion of the subscriber identification module.

17. The assembly according to claim 16 wherein the retainer comprises a radially extending portion of that extends radially inward from the frame portion on one side and the filler on the opposite side.

18. The assembly according to claim 16 wherein the filler comprises one or more of the following: a polymer, a plastic an elastomer, an adhesive and a potting compound.

19. The assembly according to claim 15 wherein the first electrical connector portion comprises a plug or a socket.

20. The assembly according to claim 15 wherein the device terminals comprise conductive pads.

\* \* \* \* \*